United States Patent
Kim et al.

(10) Patent No.: US 12,394,466 B2
(45) Date of Patent: Aug. 19, 2025

(54) MEMORY DEVICE, MEMORY SYSTEM INCLUDING THE SAME AND METHOD OF OPERATING THE SAME

(71) Applicant: Samsung Electronics Co., Ltd., Suwon-si (KR)

(72) Inventors: Hijung Kim, Suwon-si (KR); Seongjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 85 days.

(21) Appl. No.: 18/319,655

(22) Filed: May 18, 2023

(65) Prior Publication Data

US 2024/0144990 A1     May 2, 2024

(30) Foreign Application Priority Data

Nov. 2, 2022   (KR) ........................ 10-2022-0144310

(51) Int. Cl.
*G11C 11/406*     (2006.01)
*G11C 11/4078*     (2006.01)

(52) U.S. Cl.
CPC ... *G11C 11/40622* (2013.01); *G11C 11/40611* (2013.01); *G11C 11/4078* (2013.01)

(58) Field of Classification Search
CPC ......... G11C 11/40622; G11C 11/40611; G11C 11/4078
See application file for complete search history.

(56) References Cited

U.S. PATENT DOCUMENTS

| | | |
|---|---|---|
| 8,938,573 B2 | 1/2015 | Greenfield et al. |
| 9,032,141 B2 | 5/2015 | Bains et al. |
| 9,564,201 B2 | 2/2017 | Halbert et al. |
| 9,589,606 B2 | 3/2017 | Lin et al. |
| 9,747,971 B2 | 8/2017 | Bains et al. |
| 9,767,883 B2 | 9/2017 | Doo et al. |
| 9,892,779 B2 | 2/2018 | Kang et al. |
| 9,972,377 B2 | 5/2018 | Oh et al. |
| 9,978,440 B2 | 5/2018 | Cho |
| 10,090,039 B2 | 10/2018 | Doo et al. |
| 10,223,311 B2 | 3/2019 | Doo et al. |
| 10,446,216 B2 | 10/2019 | Oh et al. |
| 10,490,252 B2 | 11/2019 | Ito et al. |
| 10,600,470 B2 | 3/2020 | Bang |
| 10,607,683 B2 | 3/2020 | Shin et al. |
| 10,719,467 B2 | 7/2020 | Doo et al. |
| 10,811,077 B2 | 10/2020 | Shin et al. |

(Continued)

FOREIGN PATENT DOCUMENTS

KR    10-2022-0062710 A    5/2022

*Primary Examiner* — Min Huang
(74) *Attorney, Agent, or Firm* — Harness, Dickey & Pierce, P.L.C.

(57) ABSTRACT

A memory device includes a memory cell array including a plurality of memory cells coupled to wordlines and bitlines, a target row refresh logic configured to perform a refresh operation based on a weighted access count on the memory cell array, a register configured to store a weighted access count for each of a plurality of row addresses; an accumulator configured to accumulate a current weighted access count corresponding to an access spacing to the weighted access count stored in the register, and a calculator configured to calculate the access spacing.

20 Claims, 17 Drawing Sheets

(56) References Cited

U.S. PATENT DOCUMENTS

| | | |
|---|---|---|
| 10,818,337 B2 | 10/2020 | Kuramori et al. |
| 10,860,222 B2 | 12/2020 | Shin et al. |
| 11,037,617 B2 | 6/2021 | Gans |
| 11,087,821 B2 | 8/2021 | Son et al. |
| 11,197,531 B2 | 12/2021 | Hogan |
| 11,276,450 B2 | 3/2022 | Hedden |
| 11,354,408 B2 | 6/2022 | Ghosh et al. |
| 2015/0043284 A1* | 2/2015 | Sakuma .................. G11C 7/04 365/185.25 |
| 2022/0051716 A1* | 2/2022 | Ayyapureddi ...... G06F 13/1636 |
| 2022/0084564 A1 | 3/2022 | Choi et al. |
| 2022/0148648 A1 | 5/2022 | Hung |
| 2022/0208251 A1 | 6/2022 | Hong et al. |

\* cited by examiner

| Row No. | 2 | 1 | |
|---|---|---|---|
| Elapsed Time Lv. | 1 | 2 | |

FIG. 6

| Register | R1 | R8 | R5 | R20 | R16 | ⋯ | R13 | Row Address |
|---|---|---|---|---|---|---|---|---|
| | 15 | 11 | 8 | 2 | 3 | ⋯ | 7 | Weighted Count |

FIG. 7

MEMORY DEVICE, MEMORY SYSTEM INCLUDING THE SAME AND METHOD OF OPERATING THE SAME

CROSS-REFERENCE TO RELATED APPLICATION(S)

This application claims benefit of priority to Korean Patent Application No. 10-2022-0144310 filed on Nov. 2, 2022 in the Korean Intellectual Property Office, the disclosure of which is incorporated herein by reference in its entirety.

BACKGROUND

Example embodiments of the present disclosure relate to memory devices, memory systems including the same and methods of operating the same.

Generally, a dynamic random access memory DRAM may perform a refresh operation to maintain stored data. That is, the DRAM may maintain data stored in the cell capacitor through a refresh operation. With the development of process techniques such as an increase in integration density, a gap between DRAM cells has gradually narrowed. Also, due to the reduction of a gap between cells, interference caused by adjacent cells or wordlines has become a data reliability factor which has been increasingly important. Even when the aforementioned interference is concentrated on a specific cell, it may be difficult to restrict access to a specific address in a random access memory such as a DRAM. Accordingly, a disturbance may occur in a specific cell, and refresh characteristics of the cell may also be affected.

SUMMARY

Some example embodiments of the present disclosure provide memory devices which may reduce row hammer disturbance, memory systems including the same and methods of operating the same.

According to some example embodiments of the present disclosure, a memory device includes a memory cell array including a plurality of memory cells coupled to wordlines and bitlines; a target row refresh logic configured to perform a refresh operation based on a weighted access count on the memory cell array; a register configured to store a weighted access count for each of a plurality of row addresses; an accumulator configured to accumulate a current weighted access count corresponding to an access spacing to the weighted access count stored in the register; and a calculator configured to calculate the access spacing.

According to some example embodiments of the present disclosure, a method of operating a memory device includes receiving a row address in response to a read request or a write request from an external device; calculating an access spacing corresponding to a current access time point from a previous access time point of the row address; accumulating a weighted access count for the row address using the access spacing; and performing a refresh operation based on a weighted access count at a time.

According to some example embodiments of the present disclosure, a memory system includes at least one memory device having a plurality of banks; and a controller configured to control the at least one memory device, wherein the at least one memory device is configured to perform a refresh operation on each of the plurality of banks using an access count according to access of a row address and a weighted access count considering an access spacing from a previous time point to a current time point.

According to some example embodiments of the present disclosure, a method of operating a memory device includes calculating an access spacing from a previous time point to a current time point for a row address; updating a weighted access count according to the access spacing in a table; receiving a specific command from a controller; and performing a refresh operation using the table in response to the specific command.

BRIEF DESCRIPTION OF DRAWINGS

The above and other aspects, features, and advantages of the present disclosure will be more clearly understood from the following detailed description, taken in combination with the accompanying drawings, in which:

FIG. 6 is a diagram illustrating hardware for storing row addresses according to some example embodiments of the present disclosure;

FIG. 7 is a diagram illustrating a weighted access counter register according to some example embodiments of the present disclosure;

DETAILED DESCRIPTION

Hereinafter, example embodiments of the present disclosure will be described as below with reference to the accompanying drawings.

Generally, a selected wordline voltage may be provided to a selected wordline in a read operation or a write operation. In this case, a voltage of the wordline may increase even though the selected wordline voltage is not applied to adjacent wordlines due to a capacitive coupling effect. When repetitive access is performed on a selected wordline, electric charge may leak from memory cells corresponding to adjacent wordlines. This phenomenon in the most adjacent wordline may be referred to as row hammer. The technique of detecting and performing a refresh operation thereon has been applied for by Samsung Electronics, and may refer to US 2022-0208251, US 2022-0084564, U.S. Pat. Nos. 9,589,606, 9,767,883, 9,892,779, 9,972,377, 9,978,440, 10,090,039, 10,223,311, 10,719,467, 10,446,216, 10,600,470, 10,607,683, 10,811,077, 10,860,222, 11,087,821, and 11,197,531 incorporated by reference herein.

A memory device, a memory system having the same, and a method of operating the same in some example embodiments may, by determining a refresh target considering the number of row accesses and also the time spacing between accesses applied to the same row, prevent or reduce row hammer.

Figure 1:
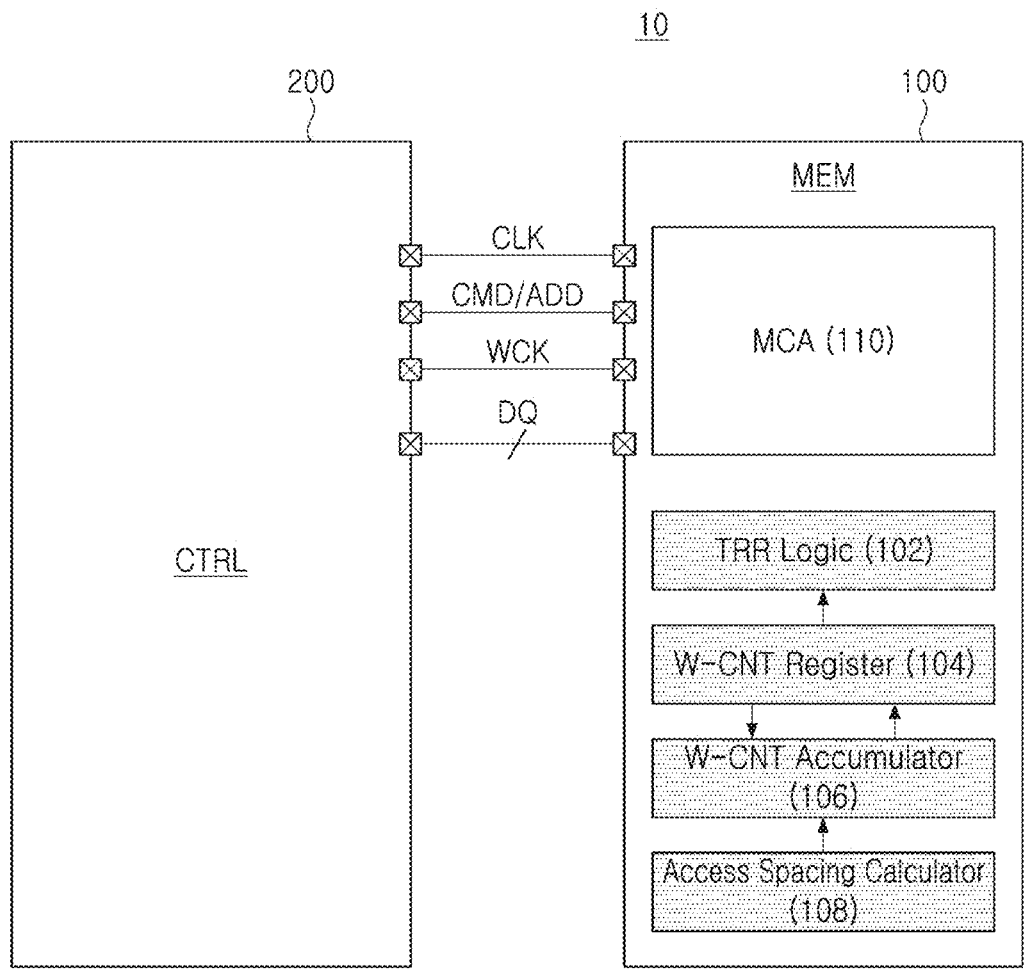
FIG. 1 is a diagram illustrating a memory system according to some example embodiments of the present disclosure.

FIG. 1 is a diagram illustrating a memory system 10 according to some example embodiments. Referring to FIG. 1, a memory system 10 may include a memory device (MEM) 100 and a memory controller (CTRL) 200 controlling the memory device 100.

The memory system 10 may be implemented to be included in a personal computer (PC) or a mobile electronic device. A mobile electronic device may be implemented as a laptop computer, a mobile phone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an Internet of Things (IoT) device, an Internet of Everything (IoE) device, and/or a drone.

The memory device 100 may be implemented to store data. In some example embodiments, the memory device 100 may be implemented as a volatile memory device. For example, the volatile memory device may be implemented as a random access memory (RAM), a dynamic RAM DRAM, a static RAM (SRAM), or a low power double data rate (LPDDR) DRAM. In some example embodiments, the memory device 100 may be implemented as a non-volatile memory device. For example, a non-volatile memory device may be implemented as an electrically erasable programmable read-only memory EEPROM, a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM).

Referring back to FIG. 1, the memory device 100 may include a target row refresh logic (TRR Logic) 102, a weighted count register 104, a weighted count accumulator 106, an access spacing calculator 108, and a memory cell array (MCA) 110.

The target row refresh logic 102 (TRR Logic) may be implemented to perform a refresh operation on a target row according to an external (e.g., CTRL; 200) request or an internal request. The target row refresh logic 102 may perform a target row refresh operation using a weighted access count W-CNT. In some example embodiments, the target row refresh operation may be activated when recognizing a row hammer attack. In some example embodiments, a weighted access count W-CNT may be calculated using data learned for a specific attack pattern.

The weighted count register 104 may be implemented to store a weighted access count for each of a plurality of target row addresses.

The weighted access count accumulator 106 may be implemented to accumulate a weighted access count corresponding to a target row. For example, the weighted access count accumulator 106 may accumulate a weighted access count for a row address requested for access (read/write request) using access spacing information. That is, the weighted access count accumulator 106 may add a weighted access count corresponding to access spacing information to an existing weighted access count for a target row from the weighted count register 104. In some example embodiments, the weighted access count accumulator 106 may be implemented by a multiplier-accumulator (MAC) of processing in memory (PIM).

The access spacing calculator 108 may be implemented to calculate an access spacing from a previous time point to a current time point with respect to a target row. In some example embodiments, the access spacing calculator 108 may include a clock/timer/counter for calculating the access spacing. The access spacing calculator 108 may output access spacing information corresponding to the calculated access spacing to the weighted access count accumulator 106.

The memory cell array (MCA) 110 may include a plurality of memory banks. Each of the plurality of memory banks may include a plurality of memory cells connected to wordlines and bitlines. Here, each of the plurality of memory cells may be implemented as a volatile memory cell or a non-volatile memory cell.

The memory controller 200 may be implemented to control the memory device 100 to read data stored in the memory device 100 or to write data to the memory device 100. The memory controller 200 may control a write operation or a read operation of the memory device 100 by providing the command CMD and address ADD to the memory device 100 in synchronization with the clock CLK. Also, data input/output through the data lines DQ may be transmitted and received between the memory controller 200 and the memory device 100 in synchronization with the data transfer clock WCK.

Also, the memory controller 200 may provide interfacing between the host and the memory device 100. The memory controller 200 exchange data and signals with the memory device 100 through control signal lines (/RAS, /CAS, /WE), an address line ADD, data lines DQ, and a warning signal line (not shown).

Generally, a memory device may count the number of active (ACT) signals of a row for a predetermined (or, alternatively, desired) period (e.g., refresh time tREFI, tRFC, tREFW), and may perform an additional refresh operation on the rows (e.g., victim rows) adjacent to the row storing the highest count. However, the degree of damage to a row adjacent to a repeatedly accessed row may be related to the number of accesses experienced by the specific row and also the time spacing between accesses. Generally, the longer the access spacing for the same row, the more electric charges may move to a capacitor in the victim row.

The memory system 10 in some example embodiments may perform a refresh operation based on a weighted access count W-CNT in which such an access spacing is additionally reflected, thereby reducing row hammer damage.

Figure 2:
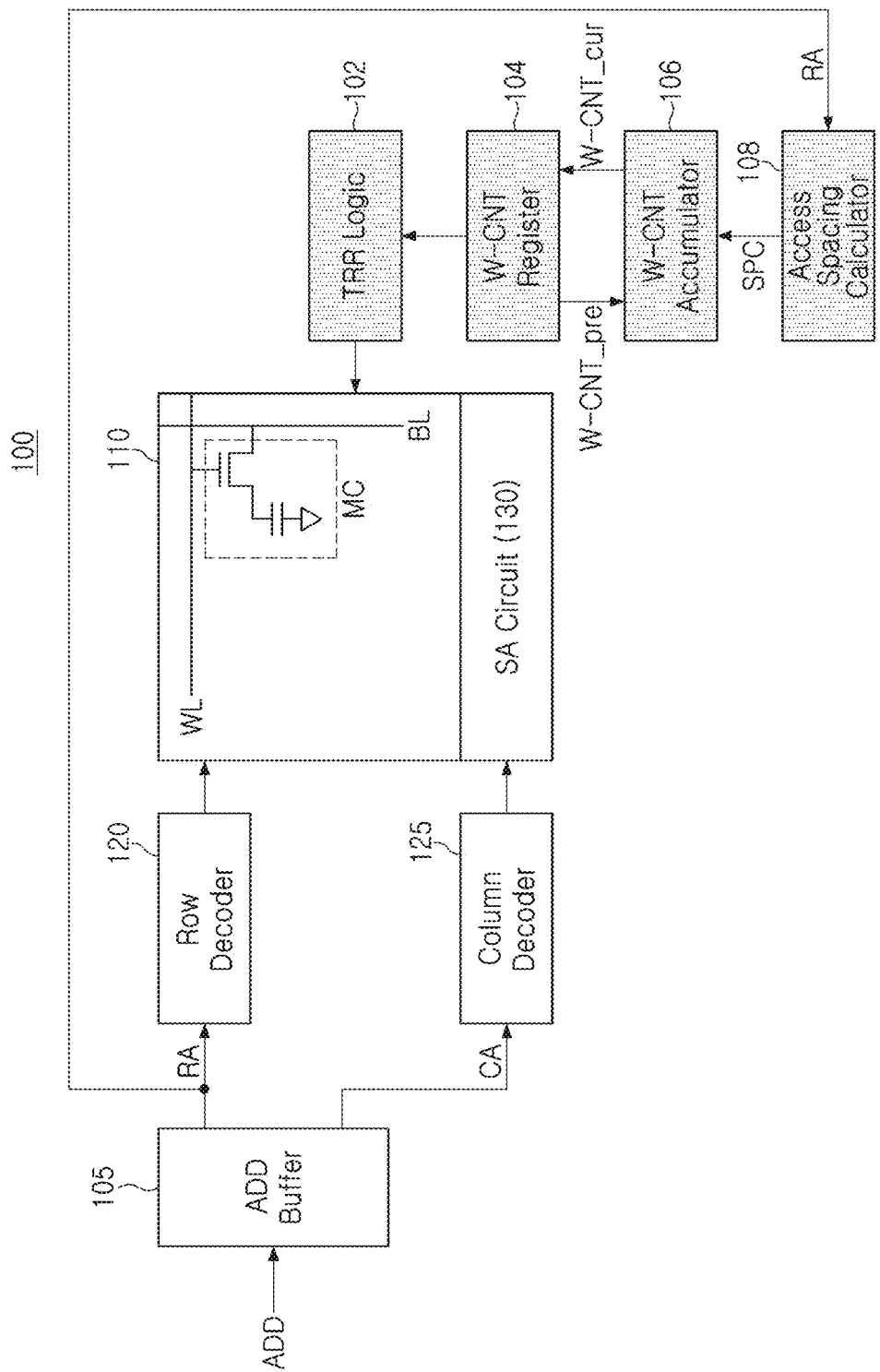
FIG. 2 is a diagram illustrating a memory device according to some example embodiments of the present disclosure.

FIG. 2 is a diagram illustrating a memory device 100 according to some example embodiments. Referring to FIG. 2, the memory device 100 may include a TRR logic 102, a weighted access count register 104, a weighted access count accumulator 106, an access spacing calculator 108, a memory cell array 110, a row decoder 120, a column decoder 125, and a sense amplifier circuit 130.

The TRR logic 102 may include first registers for storing addresses indicating a plurality of target rows, at least one counter performing an access count/act count corresponding to each of the addresses, and second registers for storing corresponding access count values. In some example embodiments, the TRR logic 102 may be activated in response to an external request or an internal request. For example, the TRR logic 102 may perform a refresh operation on at least one target row using a weighted access count W-CNT stored in the weighted access count register 104 in response to a refresh related command Here, the refresh-related command may be received periodically or non-periodically from the memory controller 200 (see FIG. 1). Also, the TRR logic 102 may perform a refresh operation on at least one target row using the weighted access count register 104 whenever the ACT count value is greater than a predetermined (or, alternatively, desired) value.

The weighted access count register 104 may store a weighted access count W-CNT corresponding to each of target rows. In some example embodiments, the weighted access count register 104 may be updated every predetermined (or, alternatively, desired) unit time. Here, the predetermined (or, alternatively, desired) unit time may be each divided time when the periodic refresh time (e.g., refresh interval time tREFI) is divided into a plurality of periods. In some example embodiments, the number of a plurality of periods may vary according to environmental information. Here, the environmental information may be information related to an operating voltage or temperature of the memory device 100.

The weighted access count accumulator 106 may accumulate a weighted access count W-CNT in response to an access request for each of target rows. For example, the weighted access count accumulator 106 may update the weighted access count register with a new weighted access count W-CNT_cur formed by accumulating weighted access counts corresponding to the access spacing information of the previous weighted access count (W-CNT_pre) from the weighted access count register 104.

The access spacing calculator 108 may receive the access-requested row address RA, may calculate the access spacing between the previous time point of the row address RA and the current time point, and may output the calculated access spacing information SPC to the weighted access count accumulator 106.

The memory cell array 110 may include a plurality of bank arrays. Each of the bank arrays may include a plurality of memory cells MC formed at intersections of a plurality of wordlines WL and a plurality of bitlines BL. As illustrated in FIG. 2, each of a plurality of memory cells may be implemented as a select transistor and a capacitor.

The row decoder 120 may be implemented to receive a row address RA, and to activate a wordline corresponding to the row address RA by decoding the row address RA. For example, the activated row decoder may select a wordline corresponding to the row address RA and may apply a wordline voltage to the selected wordline.

The column decoder 125 may be implemented to receive the column address CA, to select bitlines corresponding to the column address CA, and to connect sense amplifiers corresponding to the selected bitlines.

The sense amplifier (SA) circuit 130 may include a plurality of sense amplifiers connected to a plurality of bitlines. Each of the plurality of sense amplifiers may be implemented to sense data corresponding to a bitline. For example, each of the sense amplifiers may be connected to a bitline and a complementary bitline. Each of the plurality of sense amplifiers may be implemented to write data to a memory cell connected to a selected bitline during a write operation or to sense stored data from a memory cell connected to a selected bitline during a read operation. Also, each of the plurality of sense amplifiers may be implemented to rewrite data stored in a memory cell in a refresh operation.

Figure 3:
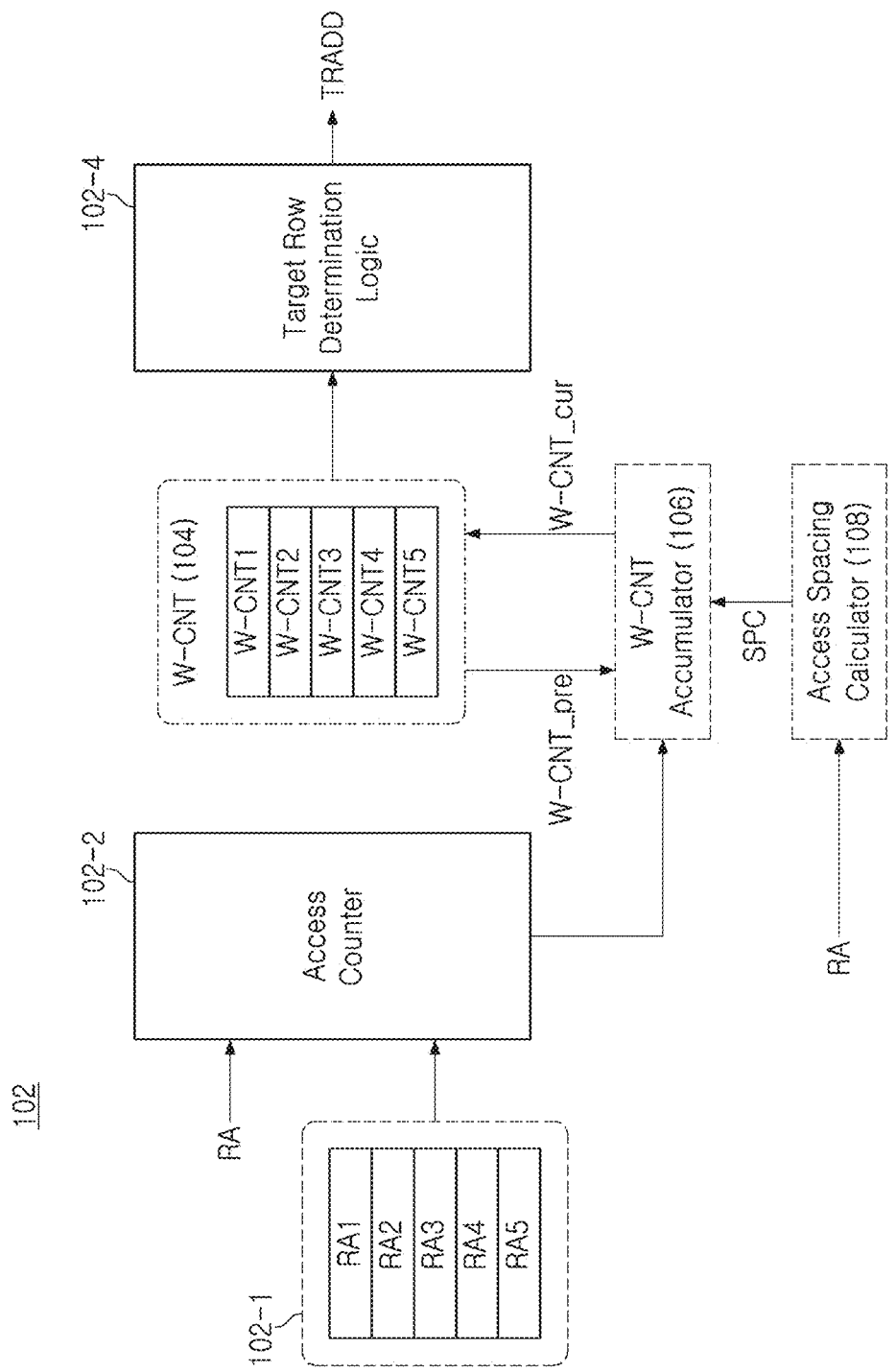
FIG. 3 is a diagram illustrating a TRR logic according to some example embodiments of the present disclosure.

FIG. 3 is a diagram illustrating a TRR logic 102 according to some example embodiments. Referring to FIG. 3, the TRR logic 102 may include a target row register 102-1, an access counter 102-2, and a target row address determination logic 102-4.

The target row register 102-1 may be implemented to store a plurality of target row addresses RA1 to RA5. Here, for ease of description, the number of target row addresses may be five, but some example embodiments thereof is not limited thereto.

The access counter 102-2 may be implemented to receive a row address RA in response to an input/output request and to count up a count value for a corresponding target row address. The counted-up count value may be transmitted to the weighted access count accumulator 106. After one of the target row addresses (TRA1 to TRA5) completes a refresh operation, the count value of a register corresponding to one of the target row addresses may be reset.

The target row address determination logic 102-4 may be implemented to select a target refresh address TRADD to perform a refresh operation using the weighted access count values W-CNT1 to W-CNT5 of the weighted access count register 104. For example, the target row address determination logic 102-4 may select row addresses adjacent to a row address having the most weighted access count W-CNT per unit time period as a target refresh address TRADD.

Also, the target row address determination logic 102-4 may be activated according to the total ACT count value. In this case, the target row address determination logic may select a target refresh address TRADD on which a refresh operation is performed using the weighted access counts W-CNT1 to W-CNT5 of the weighted access count register 104 whenever the total ACT count value becomes a multiple of a predetermined (or, alternatively, desired) value.

Also, the target row address determination logic 102-4 may select a target refresh address TRADD according to whether a weighted access count W-CNT exceeds a reference value. Here, the reference value may vary according to a temperature.

It should be understood that the target row address determination logic 102-4 in the example embodiments may select a target refresh address TRADD in various manners other than the above-described methods.

Generally, the degree of damage to a row adjacent to a specific row repeatedly accessed may depend on the number of accesses applied to the specific row and also the time spacing between the accesses. As the spacing (e.g., time) between accesses to the aggressor row (e.g., Row Precharge time tRP) increases, more specifically, as the spacing between the first access to the aggressor row and the second access subsequent thereto increases (as sufficient time is given between the two accesses), the damage to an adjacent row by the first access may increase. This is because as the access spacing (e.g., around the victim row) increases, the more electric charges may move to the charge capacitor of the victim row (for example, due to sufficient time being given for the electric charge to move), the amount of electric charge on the charge capacitor may fluctuate more. Considering this, in the example embodiments the weighted access count W-CNT considering both the access count and the access spacing may be suggested.

Figure 4:
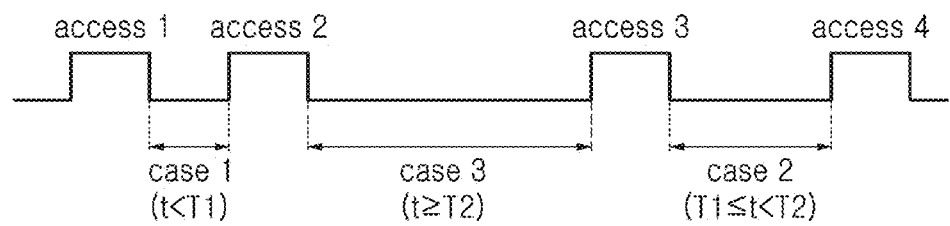
FIG. 4 is a diagram illustrating a weighted access count according to some example embodiments of the present disclosure.

FIG. 4 is a diagram illustrating a weighted access count according to some example embodiments. Basically, whenever there is an access to a specific row, the value of the access count for the row may be incremented. In the example embodiments, as the time spacing with subsequent access is incremented, the access count value may greatly increase. For example, when there is a first access and a subsequent second access to the same row, the value of the increment x of the count value according to the first access may be determined according to the value of the time spacing t between the first access and the second access as in the table below.

TABLE 1

| Case | Spacing conditions | x |
|---|---|---|
| case1 | $0 < t < T1$ | $x = 1$ |
| case2 | $T1 \le t < T2$ | $x = 2$ |
| case3 | $t \ge T2$ | $x = 3$ |

Here, T1, T2, and x are arbitrary values and may be adaptively determined based on device characteristics. The value of x quantifies how the effect a specific access to a specific row has on adjacent rows.

For example, it may be assumed that a specific row is accessed as illustrated in FIG. 4. Information on the time spacing t between adjacent accesses is also illustrated.

When only the number of accesses is counted without considering a spacing between the accesses applied to a specific row, an accumulated count value for a specific row may become 4. However, in the example embodiments, such as shown in FIG. 4, the spacing until the subsequent access (access 2) may be short, and access 1 corresponding to case 1 may be considered as being accessed once (x=1), and as the spacing until subsequent access (access 3) is long, access 2 corresponding to case 3 may be considered as being accessed 3 times (x=3), and as the spacing until subsequent access (access 4) is intermediate, access 3 corresponding to case 2 may be considered as being accessed twice (x=3). The x value of access 4 may vary according to the spacing with subsequent accesses. Here, as the cumulative count value is aggregated immediately after access 4, access 4 may be x=1. Accordingly, when the entirety of the count values x of 4 accesses are accumulated, 1+3+2+1=7. The count value considering the time spacing between accesses in the example embodiments as above may be referred to as a "weighted access count."

Figure 5:
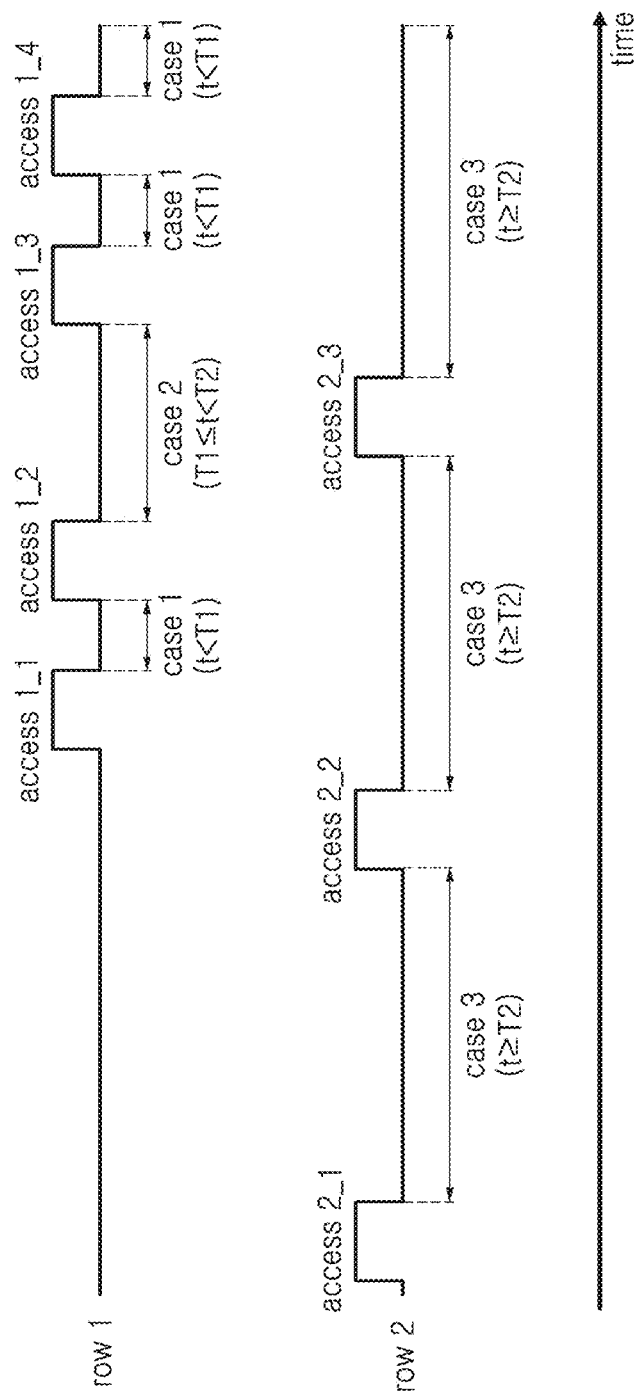
FIG. 5 is a diagram illustrating an example of weighted access count according to some example embodiments of the present disclosure.

FIG. 5 is a diagram illustrating an example of weighted access count according to some example embodiments.

Referring to FIG. 5, simple count accumulation and weighted access count accumulation according to the example embodiments are compared. Here, row 1 and row 2 may refer to two non-adjacent rows.

In the case of a method of simply counting the number of accesses, row 1 may be accessed 4 times and row 2 may be accessed 3 times during the illustrated time period. Accordingly, by determining that a row adjacent to row 1 having a greater number of accesses has received more damage due to a Rowhammer (R/H) attack than a row adjacent to row 2, an additional refresh operation may be performed on a row adjacent to row 1. However, the method of counting access in the example embodiments, which may calculate the weighted access count W-CNT in consideration of the spacing with subsequent access (that is, the length of time in which no access has occurred immediately after the corresponding access), may calculate the weighted access count values of two rows as in the table below.

TABLE 2

| Row | Simple access count method | weighted access count method |
|---|---|---|
| row 1 | 4 | 5 (1 + 2 + 1 + 1) |
| row 2 | 3 | 9 (3 + 3 + 3) |

By using the weighted access count method as disclosed in some example embodiments, it may be determined that a row adjacent to row 2 (weighted access count 9) may be damaged more due to R/H than a row adjacent to row 1 (weighted access count 5), such that an additional refresh operation may be performed on a row adjacent to row 2, which may be different from the result of the simple access count method.

As described above, the memory device 100 in some example embodiments, using the method which considers the number of accesses (access count) and also the access spacing, by more accurately identifying rows relatively more damaged by the access of adjacent rows and performing an additional refresh operation, damage caused by R/H may be effectively prevented or reduced.

A method of preventing or reducing R/H of the memory device 100 in some example embodiments may include accumulating weighted access count values for each row during a predetermined (or, alternatively, desired) time period (e.g., refresh interval time tREFI), selecting a row adjacent to the row having the highest weighted access count value as the victim row at the time point at which the time period ends, and performing a target row refresh T-refresh operation for the victim row. For each subsequent time period, the above-described operations may be periodically repeated.

As illustrated in FIG. 4, it may be difficult to predict when the subsequent access (access 2) would occur at the time point at which access 1 is sensed. That is, the weighted access count value of access 1 may be determined only at the detection point of access 2, which is a subsequent access. Accordingly, the value of the weighted access count may be represented as "basic count+additional count according to access spacing" (the sum of the basic count and additional count values), the basic count (for example, which always has a constant value, as in example 1) may be simultaneously reflected, and an additional count (which varies according to the time spacing, for example, in FIG. 5, the additional count may be determined to be 0 for case 1, 1 for case 2, and 2 for case 3) may be reflected in subsequent access in consideration of the time interval. For example, the cumulative count value of a specific row illustrated in FIG. 5 may be accumulated as below over time, such that a cumulative count value of 7 (same as the value calculated above with respect to FIG. 5) may finally be obtained.

Before access 1:0

When access 1 is sensed: 1 (add 1, which is the basic count for access 1, no additional count added since there was no previous access)

When access 2 is sensed: 2 (adds 1, which is the basic count for access 2, and adds 0 as an additional count for access 1, since the previous access 1 corresponds to case 1)

When access 3 is sensed: 5 (adds 1, which is the basic count for access 3, and adds 2 as an additional count for access 2, since the previous access 2 corresponds to case 3)

When access 4 is sensed: 7 (adds 1, which is the basic count for access 4, and adds 1 as an additional count for access 3, since the previous access 3 corresponds to case 2)

At the end of the accumulation period: 7 (Since the accumulation period ended almost immediately after access 4, access 4 is considered similar to case 1 having a sufficiently small spacing from access 4, and 0 is added as an additional count for access 4)

FIG. 6 is a diagram illustrating hardware for storing row addresses according to some example embodiments.

Referring to FIG. 6, whenever there is an access, an additional count of the previous access may be calculated. This additional count calculation may be implemented in hardware. As illustrated in FIG. 6, hardware (e.g., a memory device) may include a storage space for storing several row address numbers and an elapsed time level corresponding to each row address.

For example, the elapsed time level may be represented as 1 when the time elapsed after the corresponding row is accessed is less than T1, 2 when the time is greater than or equal to T1 and less than T2, and 3 when greater than or equal to T3. A value stored in the storage space illustrated in FIG. 6 represents data at the time point at which access 1_3 is sensed in FIG. 5. At that time point, the elapsed time level of row 2 is stored as 1 because the elapsed time from the last access (access 2_3) is less than T1, and row 1 may be stored as level 2 because the elapsed time from the last access (access 1_2) is longer than T1 but shorter than T2. At the time point at which access 1_3 to Row 1 is sensed, since the elapsed time level corresponding to row 1 in the storage space is 2, it may be determined as case 2 and the additional count for row 1 may be determined as 1.

The row stored as elapsed time level 1 may also change to elapsed time level 2 when the elapsed time exceeds T1 without additional access. When the elapsed time exceeds T2 without further access, the data for the corresponding row may be deleted from the storage space, which may be regarded as elapsed time level 3.

When only rows for which T2 has not elapsed from the last access are stored in the storage space as above, the number of rows which may be accessed during the time T2 may be limited (there is no need to store a large number of rows), it may not be necessary to increase the storage space.

FIG. 7 is a diagram illustrating a weighted access counter register according to some example embodiments.

Referring to FIG. 7, an accumulation value of a weighted access count for each row may be stored in a weighted access count register. The weighted access count register may store a plurality of row addresses and a weighted access count value corresponding to each row address. A weighted access count value to be added by a corresponding access may be calculated for a row which has been accessed, and the calculated value may be added to the weighted access count value of the corresponding row stored in the weighted access count register.

For example, as illustrated in FIG. 7, when a row R1 has been accessed and the weighted access count is increased by 2 due to the corresponding access, the value of the weighted access count of row 1 R1 stored in the current register may be updated to 17, which is 15 plus 2. Thereafter, at the end of a predetermined (or, alternatively, desired) period, the row adjacent to the row having the highest weighted access count among the rows of which addresses are stored in the register may be determined as a victim row, and an additional refresh operation may be performed on the victim row.

The weighted access count calculation method in some example embodiments may additionally reflect temperature information. Generally, the row precharge time tRP may be relatively longer at low temperature than at high temperature, which may indicate that the degree of victim may be different according to the temperature. In some example embodiments, the degree of weighted access count at high temperature may be greater than the degree of weighted access count at low temperature. In some example embodiments, the degree of weighted access count at low temperature may be greater than the degree of weighted access count at high temperature.

When a new row not stored in the register illustrated in FIG. 7 is accessed, a space to store information about the new row may be prepared by deleting information from among previously stored rows.

A memory device in some example embodiments may be implemented to store a weighted access count in a portion of a cell array.

Figure 8:
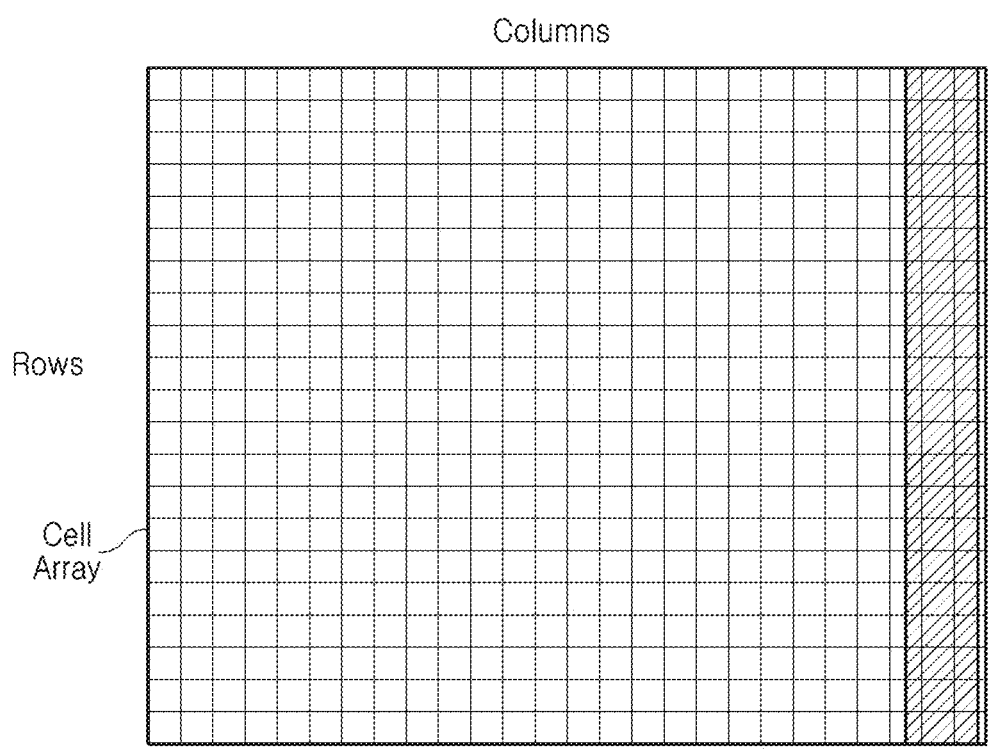
FIG. 8 is a diagram illustrating an example of storing a weighted access count in a memory device according to some example embodiments of the present disclosure.

FIG. 8 is a diagram illustrating an example of storing a weighted access count in a memory device according to some example embodiments. Referring to FIG. 8, a weighted access count of a corresponding row may be stored in a portion of cells (shaded area) among memory cells connected to each row (or wordline).

Figure 9:
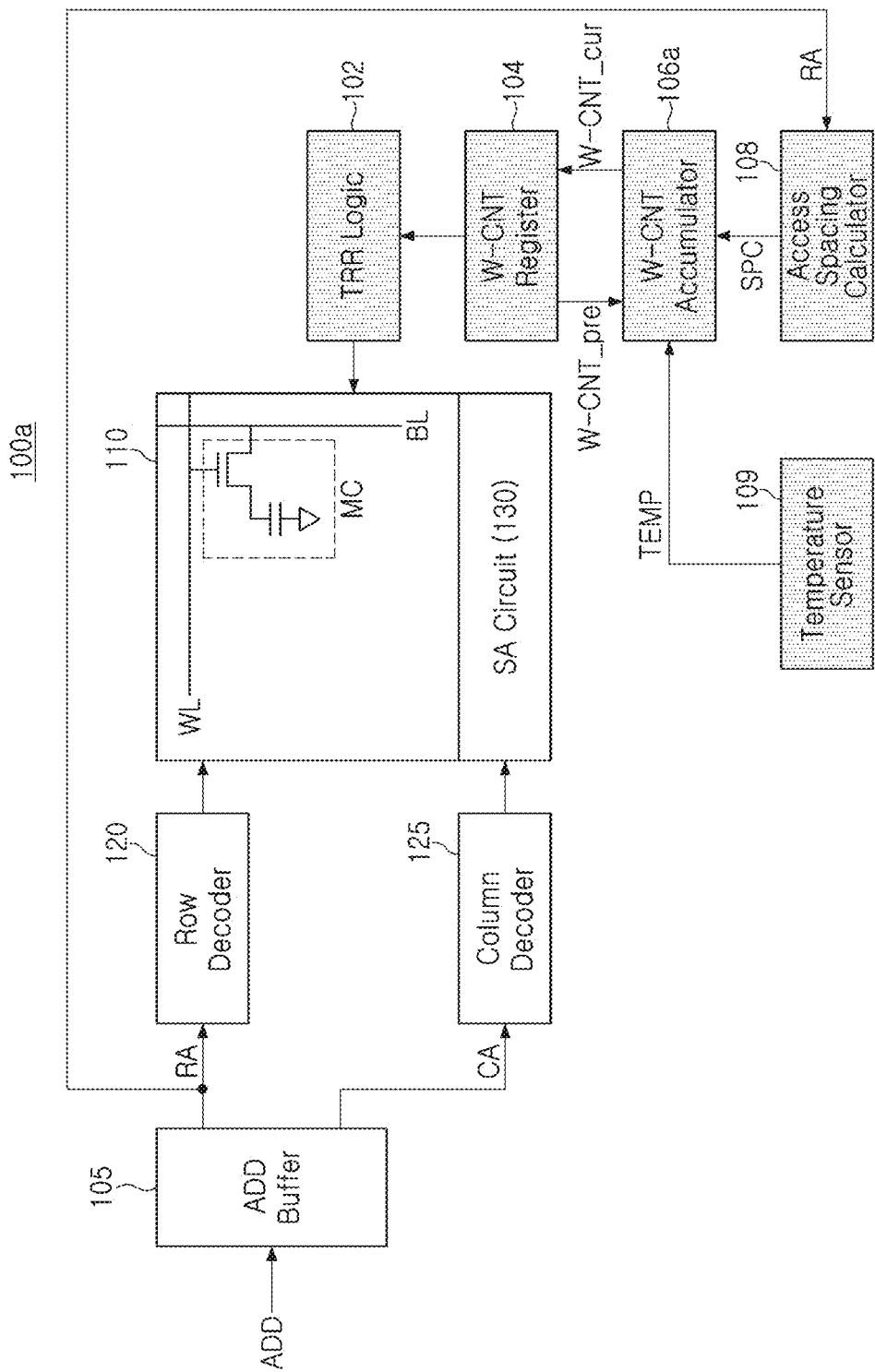
FIG. 9 is a diagram illustrating a memory device according to some example embodiments of the present disclosure.

FIG. 9 is a diagram illustrating a memory device 100a according to some example embodiments.

Referring to FIG. 9, the memory device 100a further may include a temperature sensor 109 as compared to the memory device 100 illustrated in FIG. 2. The weighted access count accumulator 106 may accumulate the weighted access count W-CNT based on the temperature information TEMP of the temperature sensor 109 and the access spacing information SPC of the access spacing calculator 108.

Figure 10:
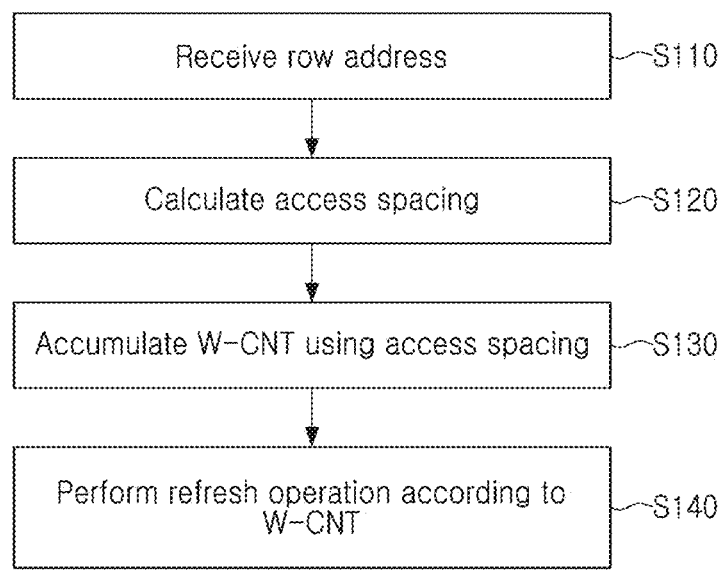
FIG. 10 is a flowchart illustrating operations of a memory device according to some example embodiments of the present disclosure.

FIG. 10 is a flowchart illustrating operations of a memory device according to some example embodiments. Referring to FIGS. 1 to 10, the memory device may operate as below.

The memory device 100 may receive a row address (S110). The memory device 100 may calculate access spacing (S120). The memory device 100 may accumulate a weighted access count W-CNT using the access spacing (S130). The memory device 100 may perform a refresh operation according to a weighted access count W-CNT (S140).

In some example embodiments, a refresh management command may be received from an external device. In some example embodiments, a weighted access count for each row may be accumulated by adding a basic count according to access and an additional count corresponding to an access spacing from a previous time point to a subsequent time point. In some example embodiments, weighted access counts for each row may be accumulated during the refresh interval time tREFI, and the victim row adjacent to the row address having the largest value among the weighted access counts at the end time point of the refresh interval time tREFI may be determined. In some example embodiments, weighted access count W-CNT may be corrected according to a temperature or a specific attack pattern.

Figure 11:
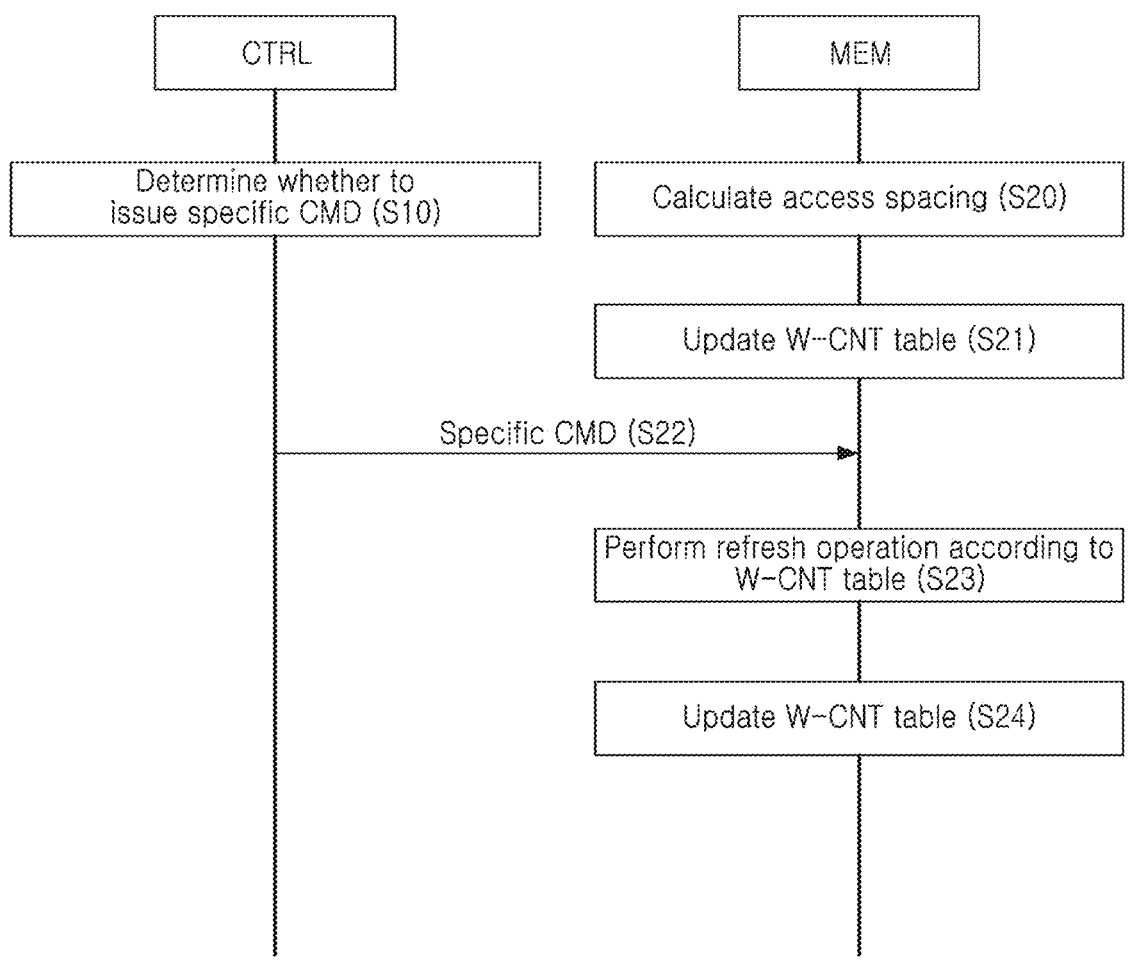
FIG. 11 is a ladder diagram illustrating a refresh operation of a memory system according to some example embodiments of the present disclosure.

FIG. 11 is a ladder diagram illustrating a refresh operation of a memory system according to some example embodiments.

Referring to FIG. 11, the memory controller CTRL may issue a specific command for performing a row hammer-related refresh operation and may transmit the issued specific command to the memory device MEM (S10). Here, the command may be a refresh management command RFM. The memory device MEM may calculate access spacing (S20). The memory device MEM may update the weighted access count table every unit time period (S21). The memory device MEM may receive a specific command CMD (e.g., a refresh management command RFM) from the controller CTRL (S22). The memory device MEM may select a target row using a weighted access count table in response to the received specific command, and may perform a refresh operation on a victim row corresponding to the selected target row (S23). Thereafter, the memory device MEM may update the weighted access count table according to the above-described refresh operation (S24).

The memory device in some example embodiments may further perform a refresh operation in response to a periodic refresh command received from the memory controller.

Figure 12:
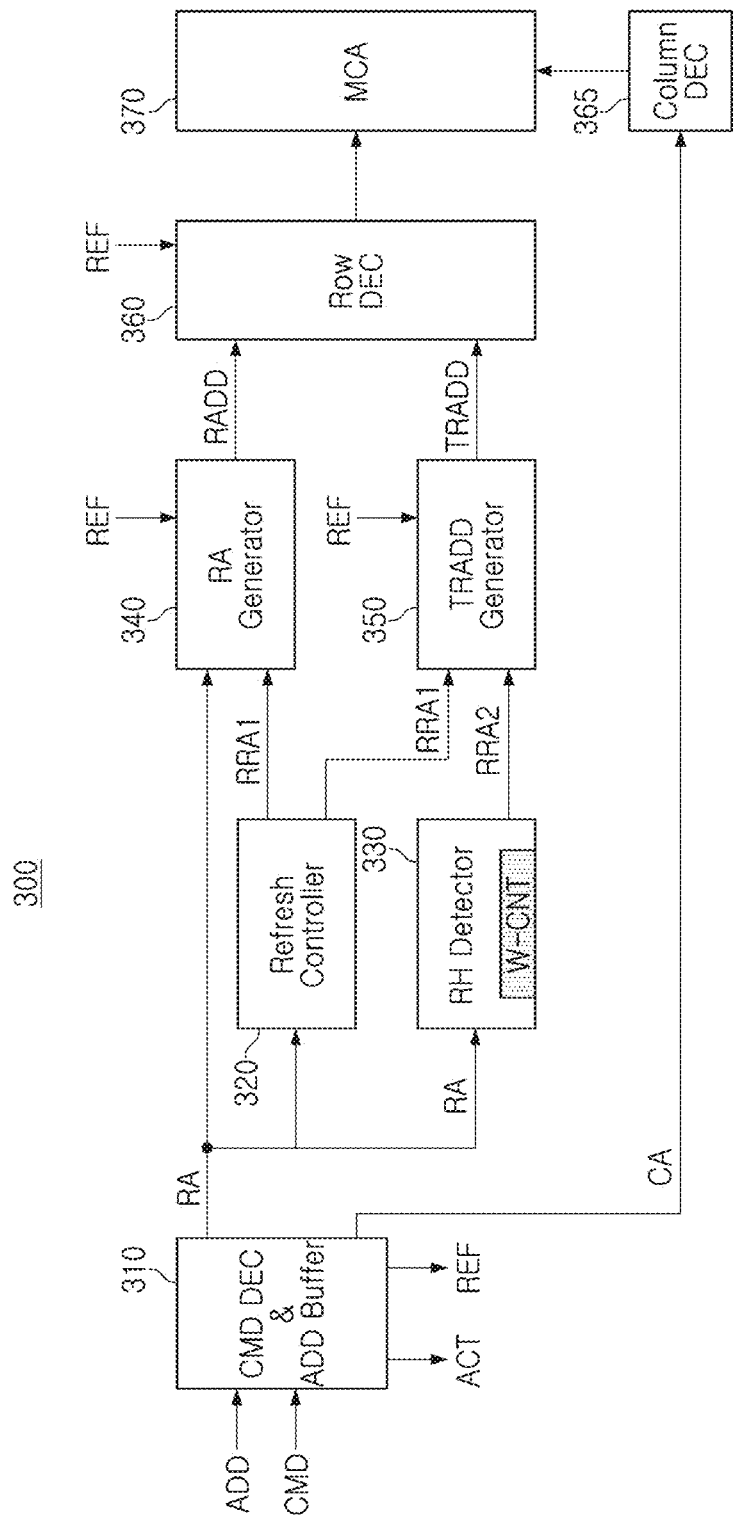
FIG. 12 is a diagram illustrating a memory device according to some example embodiments of the present disclosure.

FIG. 12 is a diagram illustrating a memory device according to some example embodiments. Referring to FIG. 12, the memory device 300 may include a command decoder and address buffer 310, a refresh controller 320, a row hammer detector 330, a row address generator 340, a target row address generator 350, a row decoder 360, a column decoder 365 and a memory cell array 370.

The command decoder and address buffer 310 may decode the command CMD and may generate an active command ACT, a refresh command REF, a read command, and/or a write command. Also, the command decoder and address buffer 310 may receive the address ADD and may output the row address RA and the column address CA. The row address RA may be input together with the active command ACT, and the column address CA may be input together with a read command or a write command. The refresh command REF may be a self-refresh command or an auto-refresh command Here, when the refresh command REF is a self-refresh command, the refresh command REF may be internally generated. Also, when the refresh command REF is an auto-refresh command, the refresh command REF may be provided from an external controller CTRL (see FIG. 1).

The refresh controller 320 may generate a first refresh row address RRA1 in response to the refresh command REF. Here, the first refresh row address RRA1 may be used to select a plurality of wordlines of the memory cell array MCA 370 or to select a plurality of blocks of the memory cell array 370.

The hammer row detector 330 may be implemented to input the row address RA in response to the active command ACT and to generate the second refresh row address RRA2 using a weighted access count.

The row address generator 340 may be implemented to select the row address RA in response to the active command ACT, to select the first refresh row address RRA1 in response to the refresh command REF and to generate the row address signal RADD.

The target row address generator 350 may be implemented to output one of the first refresh row address RRA1 and the second refresh row address RRA as a target row address signal TRADD in response to the refresh command REF.

The row decoder 360 may be implemented to generate wordline signals by decoding the row address signal RADD in response to the active command ACT, or to generate wordline signals by decoding at least one of the row address signal RADD and the target row address signal TRADD in response to a refresh command REF. Wordlines of the memory cell array 370 may be activated by the generated wordline signals.

A memory device in some example embodiments may include a row hammer protective circuit implemented in the form of a chip.

Figure 13A:
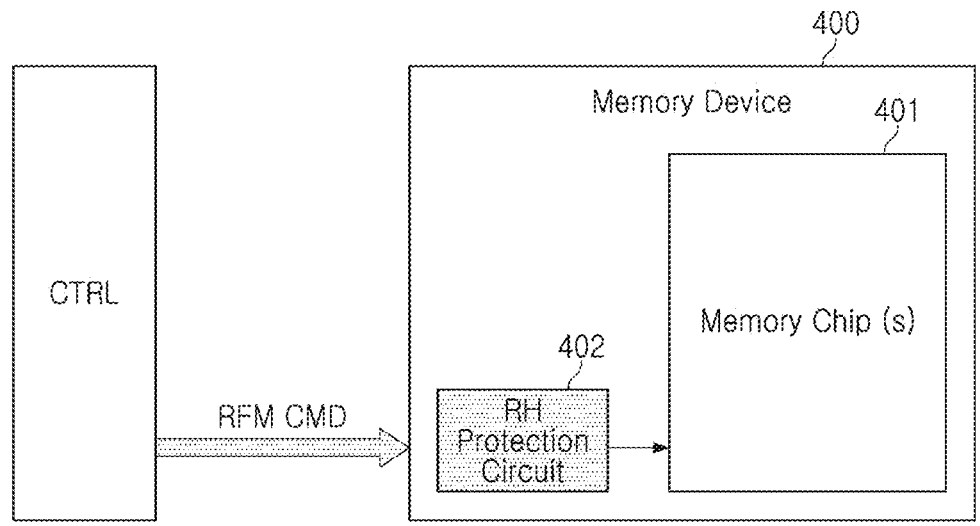
FIGS. 13A and 13B are diagrams illustrating a memory device having a row hammer protective circuit implemented in a chip form according to some example embodiments of the present disclosure.
Figure 13B:
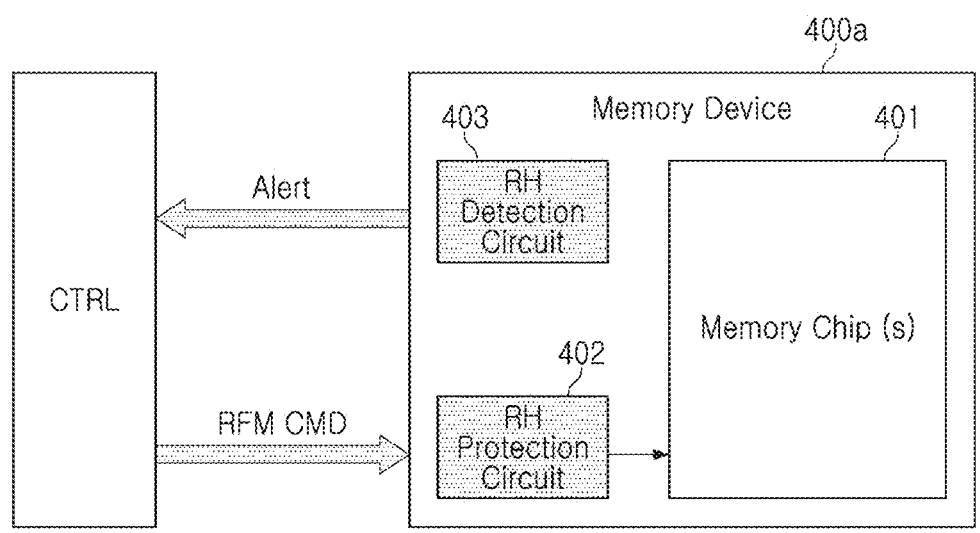

FIGS. 13A and 13B are diagrams illustrating a memory device having a row hammer protective circuit implemented in a chip form according to some example embodiments. Referring to FIG. 13A, a memory device 400 may include at least one memory chip 401 and a row hammer protective circuit 402 to protect the memory chip 401 from a row hammer. The row hammer protective circuit 402 may perform a row hammer defense operation using the weighted access count W-CNT described with reference to FIGS. 1 to 12 in response to a command (e.g., RFM CMD) received from the controller CTRL.

The memory device in some example embodiments may monitor the row hammer in real time and may output a warning signal according to the result of monitoring. Referring to FIG. 13B, the memory device 400a further may include a row hammer detector circuit 403 as compared to that in FIG. 13A. The row hammer detector circuit 403 may monitor a row hammer attack in real time and may output a warning signal to a controller CTRL when a row hammer attack is expected (or for example, when a row hammer attack is recognized). In some example embodiments, the warning signal may be output through at least one data line DQ or at least one data mask inversion line DMI. In some example embodiments, the warning signal may be output through a separate line. The controller CTRL may receive the warning signal and may output a command (e.g., RFM CMD) for activating the row hammer protective circuit 402 to the memory device 400a.

The memory device in some example embodiments may operate in conjunction with a refresh management command.

Figure 14:
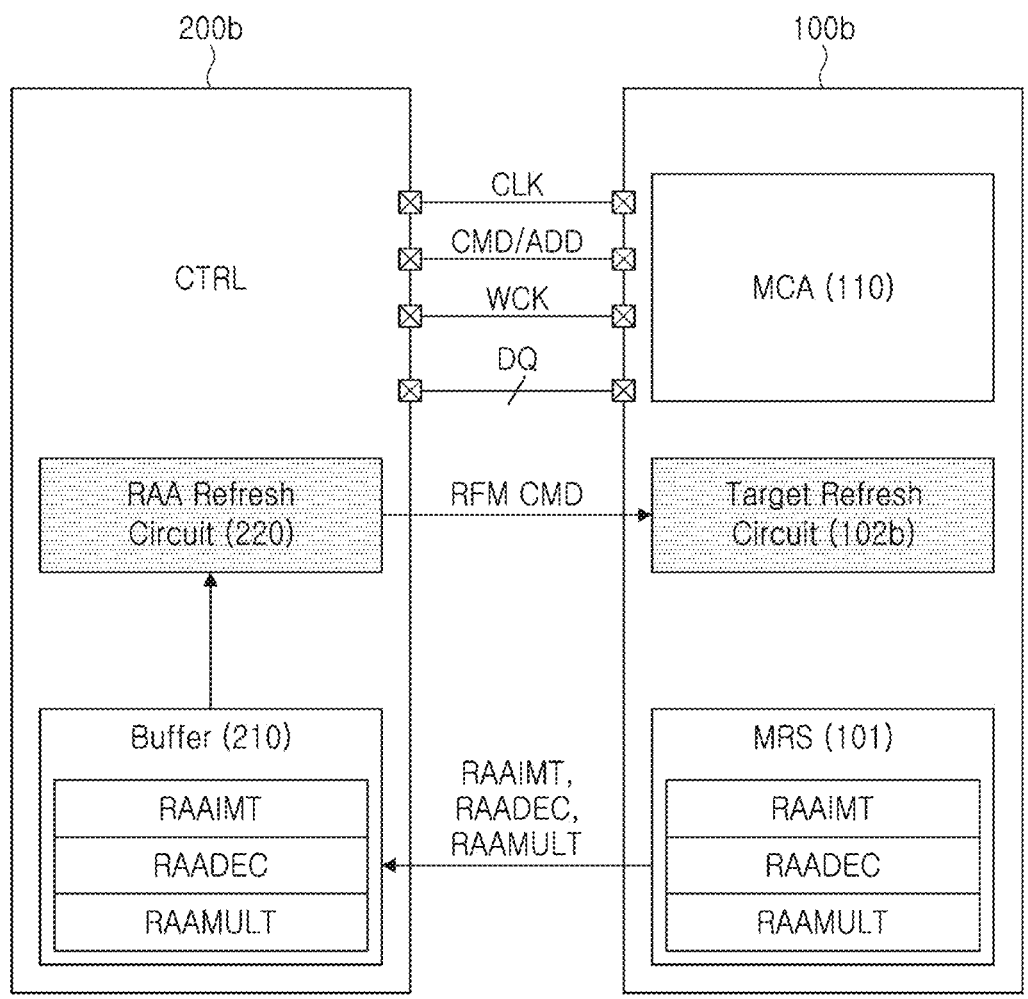
FIG. 14 is a diagram illustrating a memory system according to some example embodiments of the present disclosure.

FIG. 14 is a diagram illustrating a memory system according to some example embodiments. Referring to FIG. 14, the memory system 20 may include a memory device 100b and a memory controller 200b.

Referring back to FIG. 14, the memory device 100b may include a mode register circuit MRS 101, a target refresh circuit 102b, and a MCA 110.

The mode register circuit 101 may include a plurality of mode registers for storing values for setting an operation mode. Also, the mode register circuit 101 may include a first mode register 101-1, a second mode register 101-2, and a third mode register 101-3 for performing a refresh operation on a target row, not shown.

The first mode register 101-1 may store a reference value RAAIMT (e.g., a first value) for comparing rolling accumulated ACT (RAA) values. Here, the RAA value may refer to the number of actual ACTs measured by the system (e.g., a controller) for the target row. That is, RAAIMT may be a threshold value for issuing a refresh management mode RFM command. For example, the controller 200 may issue an RFM command when the RAA value for the target row is greater than RAAIMT. The second mode register 101-2 may store a minimum value RAADEC (e.g., a second value) for decreasing the stored RAA value after issuing the RFM command RAADEC may be the minimum unit value of the RAA value which may be reduced when an RFM command is issued once. In some example embodiments, the RAA value may be reduced by RAAIMT×RAADEC after issuing the RFM command. The third mode register 101-3 may store a value RAAMULT (e.g., a third value) necessary for determining the maximum value RAAMMT of the RAA value. RAAMULT may be a parameter which determines how many times RAADEC is reduced when a REF command is issued once. Here, the maximum value of the RAA value (RAAMMT) may be RAAIMT×RAAMULT.

In some example embodiments, RAAIMT, RAADEC, and RAAMULT may be determined by training during an initialization operation of the memory device 100. In some example embodiments, RAAIMT, RAADEC, and RAAMULT may be updated in real time in response to a RFM command. For example, RAAIMT, RAADEC, and RAAMULT may be determined according to a risk level.

The target refresh circuit 102b may be implemented to perform a refresh operation using a weighted access count W-CNT in response to an RFM command.

The memory controller 200b may transmit a refresh command with reference to a warning signal provided from the memory device 100. For example, when a warning signal output from the memory device 100b is activated, the memory controller 200b may transmit an auto-refresh command by control signals (e.g., /RAS, /CAS, /WE) to the memory device 100b. Also, the memory controller 200b may issue an RFM command according to the RAA value. The memory controller 200b may include a buffer memory 210 and an RAA refresh circuit 220. The buffer memory 210 may receive and store RAAIMT, RAADEC, and RAAMULT from the memory device 100. The RAA refresh circuit 220 may be implemented to store and manage RAA values for a plurality of target rows. The RAA refresh circuit 220 may issue an RFM command according to the RAA value using RAAIMT, RAADEC, and RAAMULT for the target row. Here, the RFM command may include a specific bit (e.g., an RU bit) instructing to change stored values RAAIMT, RAADEC, and RAAMULT of the mode register circuit 101 of the memory device 100.

The refresh operation based on a weighted access count of a memory device in some example embodiments may be implemented using an access count table for a target address.

Figure 15A:
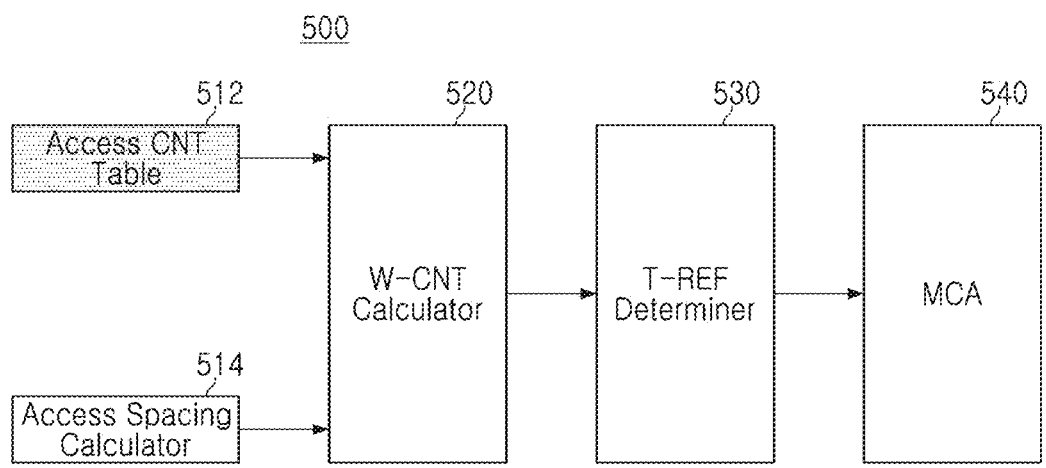
FIGS. 15A and 15B are diagrams illustrating a memory device according to some example embodiments of the present disclosure.

FIG. 15A is a diagram illustrating a memory device 500 according to some example embodiments. Referring to FIG. 15A, the memory device 500 may include an access count table 512, an access spacing calculator 514, a weighted access count calculator 520, a target-refresh discriminator 530, and a cell array 540.

The access count table 512 may store access count values for target addresses. An access spacing calculator 514 may be implemented to calculate access spacing for a target address. The weighted access count calculator 520 may calculate a weighted access count W-CNT using the access count value and the access spacing. The target-refresh discriminator 530 may perform a refresh operation on the victim row when the weighted access count W-CNT is greater than or equal to a reference value.

Figure 15B:
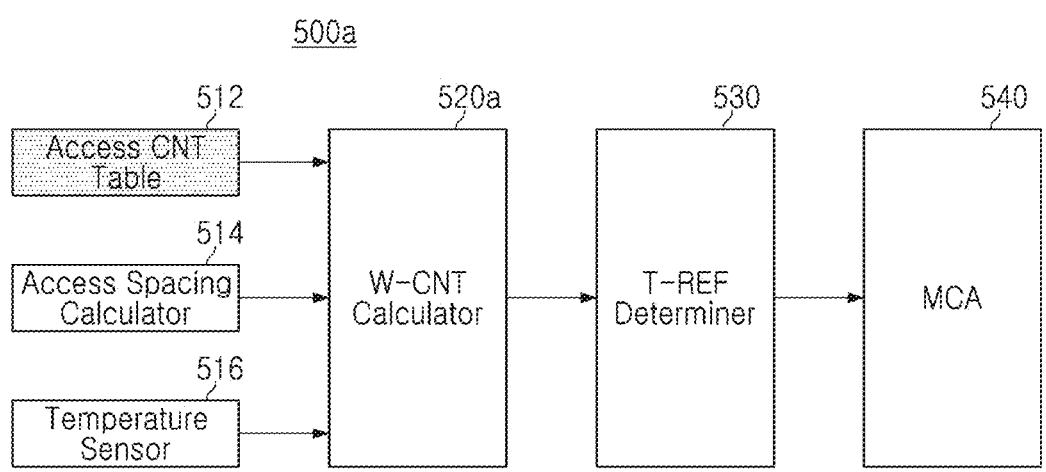

FIG. 15B is a diagram illustrating a memory device 500a according to some example embodiments. Referring to FIG. 15B, the memory device 500a may further include a temperature sensor 516 as compared to the memory device 500 illustrated in FIG. 15A. The weighted access count calculator 520a may calculate a weighted access count W-CNT using access count values, access spacing, and temperature information. Here, temperature information may be received from the temperature sensor 516.

The example embodiments may be applicable to a memory module.

Figure 16:
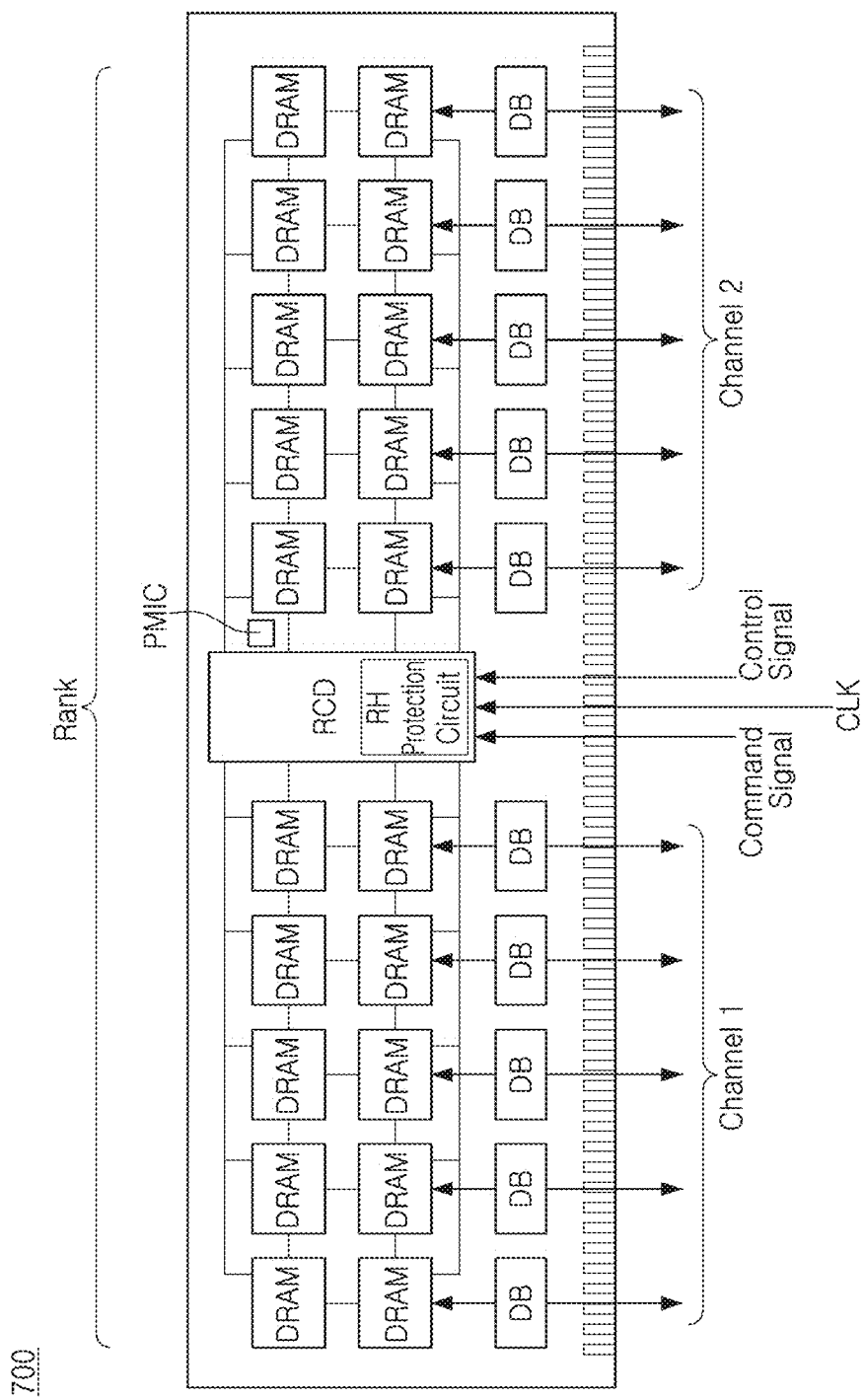
FIG. 16 is a diagram illustrating a memory module according to some example embodiments of the present disclosure.

FIG. 16 is a diagram illustrating a memory module 700 according to some example embodiments. Referring to FIG. 16, the memory module 700 may include a plurality of memory chips DRAM each including a memory cell array, a memory controller, a buffer chip RCD for routing transmit/receive signals or managing memory operations for the memory chips, and a power management chip PMIC. Each of the plurality of memory chips may perform a refresh operation on target rows using a weighted access count W-CNT as described with reference to FIGS. 1 to 15.

The RCD may control memory chips DRAM and a power management chip PMIC under control of a memory controller. For example, the RCD may receive a command signal, a control signal, and a clock signal from a memory controller. In some example embodiments, the RCD may include a row hammer protective circuit.

The memory chips DRAM may be connected to a corresponding data buffer among the data buffers DB through corresponding data transmission lines and may transmit and receive data signals DQ and data strobe signals DQS. The memory chips DRAM may be connected to the data buffer DB through corresponding data transmission lines and may exchange parity data PRT and data strobe signal DQS.

The SPD chip may be a programmable read only memory EEPROM. The SPD chip may include initial information or device information of the memory module 700. For example, the SPD chip may include initial information or device information such as the module type, module configuration, storage capacity, module type, and execution environment of the memory module 700. When a memory system including the memory module 700 is booted, the memory controller may read device information from the SPD chip and may recognize the memory module based on the read device information. In some example embodiments, a rank may include eight bank groups. Each of the bank groups may include four banks. In some example embodiments, memory chips may be divided into memory chips dedicated to a first channel and memory chips dedicated to a second channel.

The memory controller may transmit a command to each channel of the memory chip DRAM. Each channel may have an independent command, address, and bus to operate in parallel with each other. A channel may have one or more ranks, and each rank may have an independent DRAM device. Also, the entirety of ranks within a channel may perform operations in parallel. Each rank may have a plurality of banks, and DRAM cells may be present in a two-dimensional array within the banks. The banks may operate in parallel.

The memory device in some example embodiments may be applicable to a computing device.

Figure 17:
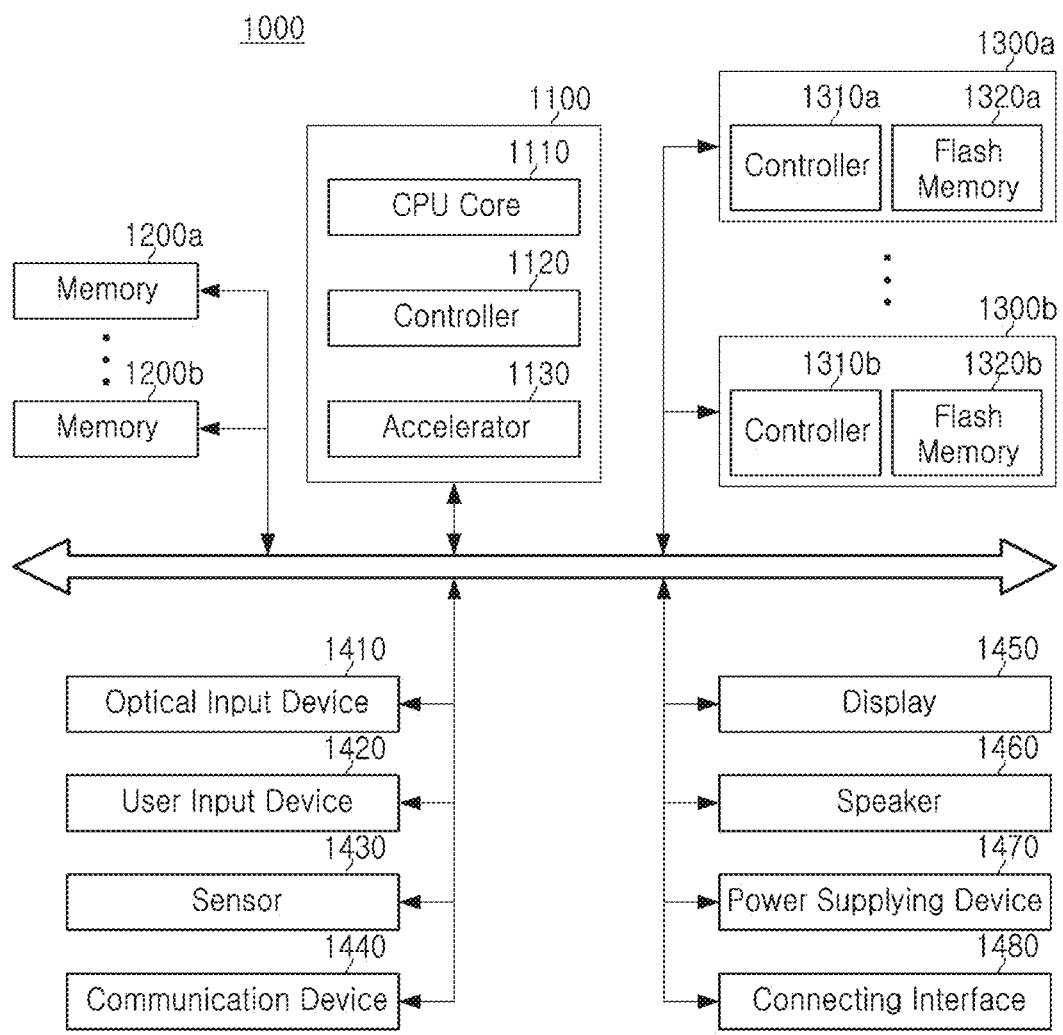
FIG. 17 is a diagram illustrating a computing system according to some example embodiments of the present disclosure.

FIG. 17 is a diagram illustrating a computing system according to some example embodiments. Referring to FIG. 17, a computing system 1000 may include a main processor 1100, memories 1200a and 1200b, and storage devices 1300a and 1300b, and may further include an image capturing device 1410 (also referred to as optical input device 1410), a user input device 1420, a sensor 1430, a communication device 1440, a display 1450, a speaker 1460, a power supplying device 1470 and a connecting interface 1480.

The main processor 1100 may control overall operation of the system 1000, and more specifically, the operation of other components included in the system 1000. The main processor 1100 may be implemented as a general-purpose processor, a dedicated processor, and/or an application processor.

The main processor 1100 may include one or more CPU cores 1110, and may further include a controller 1120 for controlling the memories 1200a and 1200b or the storage devices 1300a and 1300b. In some example embodiments, the main processor 1100 may further include an accelerator block 1130 which may be a dedicated circuit for high-speed data operation such as artificial intelligence (AI) data operation. The accelerator block 1130 may include a graphics processing unit (GPU), a neural processing unit (NPU), or a data processing unit (DPU), and may be implemented as a chip physically independent from other components of the main processor 1100.

The memories 1200a and 1200b may be used as the main memory device of the system 1000 and may include volatile memory such as SRAM or DRAM, or may also include non-volatile memory such as flash memory, PRAM, or RRAM. The memories 1200a and 1200b may also be implemented in the same package as the main processor 1100. Also, the memories 1200a and 1200b may calculate a weighted access count W-CNT as described with reference to FIGS. 1 to 16 and may perform a target refresh operation using the weighted access count W-CNT.

The storage devices 1300a and 1300b may function as non-volatile storage devices which may store data regardless of whether or not power is supplied, and may have a relatively large storage capacity as compared to the memories 1200a and 1200b. The storage devices 1300a and 1300b may include storage controllers 1310a and 1310b and non-volatile memory (NVM) storage 1320a and 1320b for storing data under control of the storage controllers 1310a and 1310b. The non-volatile memories 1320a and 1320b may include a two-dimensional (2D) structure or a V-NAND flash memory of a 3-dimensional (3D) structure, or may include other types of non-volatile memories such as PRAM or RRAM.

The storage devices 1300a and 1300b may be included in the system 1000 while being physically separated from the main processor 1100, or may be implemented in the same package as the main processor 1100. Also, the storage devices 1300a and 1300b may have a form such as a solid state device (SSD) or a memory card, such that the storage devices 1300a and 1300b may be coupled to other components of the system 1000 to be attached thereto and detached therefrom through an interface such as a connection interface 1480 to be described later. The storage devices 1300a and 1300b may be implemented as devices to which standard protocols such as universal flash storage (UFS), embedded multi-media card (eMMC), or non-volatile memory express (NVMe) are applied, but some example embodiments thereof is not limited thereto.

The image capturing device 1410 may obtain a still image or a moving image, and may be implemented as a camera, a camcorder, or a webcam. The user input device 1420 may receive various types of data input from a user of the system 1000, and may be implemented as a touch pad, a keypad, a keyboard, a mouse, and/or a microphone. The sensor 1430 may sense various types of physical quantities which may be obtained from an external entity of the system 1000 and may convert the detected physical quantities into electrical signals. The sensor 1430 may be implemented as a temperature sensor, a pressure sensor, an illuminance sensor, a position sensor, an acceleration sensor, a biosensor, and/or a gyroscope.

The communication device 1440 may transmit and receive signals between other devices outside the system 1000 according to various communication protocols. Such a communication device 2440 may include an antenna, a transceiver, and/or a modem. The display 1450 and the speaker 1460 may function as output devices which may output visual information and auditory information to the user of the system 1000, respectively. The power supplying device 1470 may appropriately convert power supplied from a battery built in the system 1000 or an external power source and may supply power to each component of the system 1000.

The connecting interface 1480 may provide a connection between the system 1000 and an external device connected to the system 1000 and exchanging data with the system 1000. The connecting interface 2480 may be implemented by various interface method such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), Universal Flash Storage (UFS), embedded universal flash storage (eUFS), and/or compact flash (CF) card interface.

Figure 18:
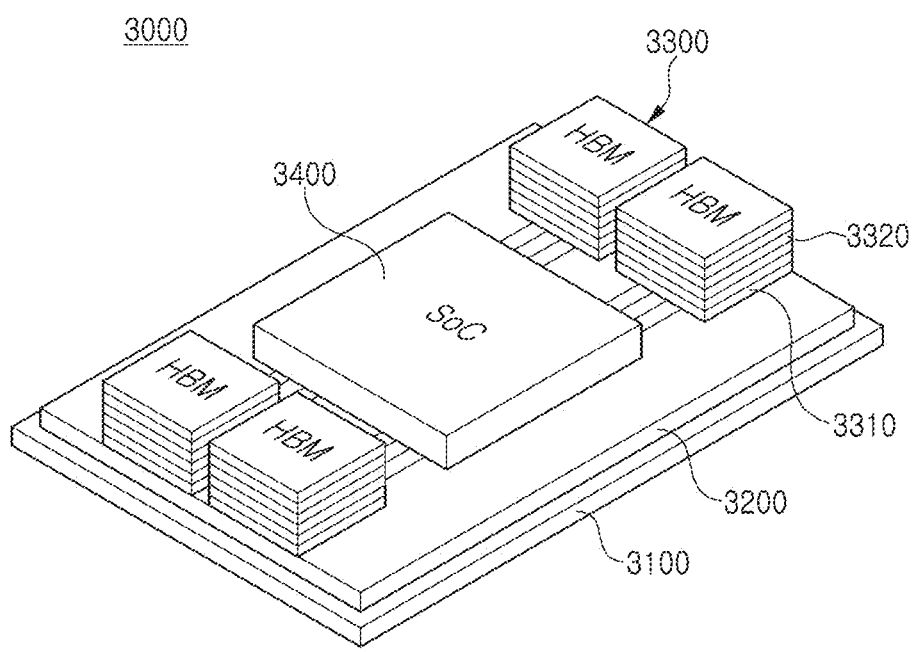
FIG. 18 is a diagram illustrating a semiconductor package including stack semiconductor chips according to some example embodiments of the present disclosure.

FIG. 18 is a diagram illustrating a semiconductor package including a stack semiconductor chip according to some example embodiments. Referring to FIG. 18, a semiconductor package 3000 may be implemented as a memory module including at least one stack semiconductor chip 3300 mounted on a package substrate 3100 such as a printed circuit board and a system-on-chip (SOC) 3400. An interposer 3200 may be selectively further provided on the package substrate 3100. The stack semiconductor chip 3300 may be formed in CoC (Chip-on-Chip).

The stack semiconductor chip 3300 may include at least one memory chip 3320 stacked on a buffer chip 3310 such as a logic chip. The memory chip 3320 may include a row hammer protective circuit using a victim point table as described with reference to FIGS. 1 to 17.

The buffer chip 3310 and at least one memory chip 3320 may be connected to each other by a through silicon via (TSV). The buffer chip 3320 may perform a training operation on the memory chip 3320. The stack semiconductor chip 3300 may be, for example, 500 GB/sec to 1 TB/sec, or higher bandwidth memory (HBM).

A memory device and a method of operation the same in some example embodiments may reflect that the number of row accesses and also the time spacing between accesses to the same row may affect the degree of damage to adjacent rows with respect to the R/H phenomenon (in which data in an adjacent row is deteriorated due to intensive access to a specific row address). In the example embodiments, whenever a specific row is accessed, the value of the access count for the row may be incremented, and as the time spacing between subsequent accesses increases, the access count value may increase significantly. The count value reflecting both the number of accesses and the time spacing may be referred to as "weighted access count," and an additional refresh target may be determined based on the corresponding weighted access count value.

According to the example embodiments, by performing additional refresh by more accurately identifying the relatively more damaged rows due to the access of adjacent rows, damage due to R/H may be effectively prevented or reduced.

The method for reducing row hammers in a memory device in some example embodiments may be to 1) identify access to a row, and 2) add a weighted access count to a row to which access is made, and the value of the weighted access count to be added may be determined based on the time spacing between access and subsequent access, 3) the weighted access count value may be accumulated for each row during a predetermined (or, alternatively, desired) time spacing, and 4) when the time spacing ends, the aggressor rows may be determined according to the order in which the accumulated weighted access count value is greater, and the victim row adjacent to the aggressor row may be additionally refreshed. The value of the weighted access count added here may be larger as the time spacing is longer. Also, the value of the weighted access count may be the sum of the basic count and the additional count value, and the basic count value may be determined at the time of a corresponding access, and the additional count value may be determined according to a time spacing at the time of subsequent access. There may be an upper limit to the value of the weighted access count (saturate over a predetermined or, alternatively, desired time spacing).

Also, the example embodiments may be operated only when it is determined that there is an R/H attack. A weighted access count may be calculated using pre-learned data (e.g., from a learned neural network or the like) for a specific attack pattern.

In the example embodiments, a weighted access count may be initiated in consideration of the number of row accesses related to R/H correspondence and the time spacing between accesses using a row precharge time (tRP). The access spacing in some example embodiments may use the charge transfer related time tRP as a main index, but some example embodiments thereof is not limited thereto. The access spacing in some example embodiments may use a row address strobe (tRAS). In addition to tRP, other factors such as temperature and ACT rising may be used to determine the weighted access count. A functional relationship between the length of tRP and the weighted access count may be experimentally determined.

According to the aforementioned example embodiments, the memory device, the memory system including the same and the method of operating the same may, by performing refresh considering the number of accesses and also the access spacing comprehensively, prevent or reduce a row hammer attack more effectively.

The memory system 10 (or other circuitry, for example, memory device 100, 100*a*, 300, 400, 400*a*, 500, 500*a*, memory controller 200, TRR logic 102, 102*b*, weighted count register 104, ADD buffer 105, weighted count accumulator 106, access spacing calculator 108, temperature sensor 109, 516, MCA 110, row decoder 120, column decoder 125, sense amplifier circuit 130, target row register 102-1, access counter 102-2, target row address determination logic 102-4, command decoder and address buffer 310, refresh controller 320, row hammer detector 330, row address generator 340, target row address generator 350, row decoder 360, column decoder 365 memory cell array 370, R/H protection circuit 402, $/H detection circuit 403, MRS 101, buffer 210, RAA refresh circuit 220, access count table 512, access spacing calculator 514, weighted access count calculator 520, 520*a*, target-refresh discriminator 530, cell array 540, memory module 700, computing system 1000, main processor 1100, memories 1200*a* and 1200*b*, storage devices 1300*a* and 1300*b*, image capturing device 1410, user input device 1420, sensor 1430, communication device 1440, display 1450, speaker 1460, power supplying device 1470, connecting interface 1480) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments have been illustrated and described above, it will be configured as apparent to those skilled in the art that modifications and variations could be created without departing from the scope of the present disclosure as defined by the appended claims.

What is claimed is:

1. A memory device, comprising:
   a memory cell array including a plurality of memory cells coupled to wordlines and bitlines;
   a target row refresh logic configured to perform a refresh operation based on a weighted access count on the memory cell array;
   a register configured to store the weighted access count for each of a plurality of row addresses;
   an accumulator configured to accumulate a current weighted access count corresponding to an access spacing to the weighted access count stored in the register, the access spacing being based on a first access and a subsequent access of a target row of the memory device; and
   a calculator configured to calculate the access spacing.

2. The memory device of claim 1, wherein the target row refresh logic is configured to
   select a row address corresponding to a largest count value among weighted access counts stored in the register at times, and
   perform the refresh operation on a victim row address adjacent to the selected row address.

3. The memory device of claim 1, wherein the accumulator is configured to accumulate the weighted access count corresponding to a row address accessed during a period.

4. The memory device of claim 1, wherein a weighted access count having a longer access spacing is greater than a weighted access count having a shorter access spacing.

5. The memory device of claim 1, wherein
   the weighted access count is determined by a sum of a basic count and an additional count,
   the basic count is counted up for each access, and
   the additional count is determined according to the access spacing during @ the subsequent access.

6. The memory device of claim 1, wherein the weighted access count has an upper limit value at which the access spacing corresponds to a time period or more.

7. The memory device of claim 1, wherein
   the calculator is configured to determine one of a first value, a second value greater than the first value, and a third value greater than the second value as an accumulated weighted access count according to the access spacing,
   the first value is selected based on the access spacing being greater than 0 and less than a first time period,
   the second value is selected based on the access spacing being greater than or equal to the first time period and less than a second time period, and the third value is selected based on the access spacing being greater than or equal to the second time period.

8. The memory device of claim 1, wherein the target row refresh logic is configured to perform the refresh operation is activated based on a row hammer attack being recognized.

9. The memory device of claim 1, wherein the memory device is configured to calculate the weighted access count using data learned for a specific attack pattern.

10. The memory device of claim 1, wherein an accumulation value of the weighted access count varies according to a temperature of the memory device.

11. An operating method of a memory device, the method comprising:
   receiving a row address in response to a read request or a write request from an external device;
   calculating an access spacing corresponding to a current access time point from a previous access time point of the row address;
   accumulating a weighted access count for the row address using the access spacing; and
   performing a refresh operation based on the weighted access count at a time.

12. The method of claim 11, further comprising:
   receiving a refresh management command from the external device.

13. The method of claim 11, wherein the accumulating the weighted access count includes accumulating the weighted access count for each row by adding a basic count according to an access and an additional count corresponding to the access spacing from a previous access time point to a subsequent access time point.

14. The method of claim 11,
   wherein weighted access counts for each row are accumulated during a refresh interval time, and
   wherein the performing the refresh operation includes determining a victim row adjacent to a row address having a largest value among the weighted access counts at a time point when the refresh interval time ends.

15. The method of claim 11, wherein the accumulating the weighted access count includes correcting the weighted access count according to a temperature or a specific attack pattern.

16. A memory system, comprising:
   at least one memory device having a plurality of banks; and
   a controller configured to control the at least one memory device,
   wherein the at least one memory device is configured to perform a refresh operation on each of the plurality of banks using an access count according to access of a row address and a weighted access count considering an access spacing from a previous time point to a current time point, the access spacing being based on a previous access and a current access of a target row of the memory device.

17. The memory system of claim 16, wherein the at least one memory device includes:
   a table configured to store the access count for each row;
   an access spacing calculator configured to calculate the access spacing for each row;
   an access count calculator configured to receive the access count from the table and the access spacing from the access spacing calculator, and to calculate the weighted access count according to the access count and the access spacing; and
   a target refresh discriminator configured to select a corresponding row address as a target row address when the weighted access count exceeds a reference value and to perform the refresh operation on a victim row adjacent to the selected target row address.

18. The memory system of claim 16, wherein the at least one memory device includes:
   a table configured to store the access count for each row;
   an access spacing calculator configured to calculate the access spacing for each row;
   a temperature sensor configured to sense a temperature of the at least one memory device;
   an access count calculator configured to receive the access count from the table, the access spacing from the access spacing calculator, and temperature information from the temperature sensor, and to calculate the weighted access count according to the access count, the access spacing, and the temperature information; and
   a target refresh discriminator configured to select a corresponding row address as a target row address when the weighted access count exceeds a reference value and to perform the refresh operation on a victim row adjacent to the selected target row address.

19. The memory system of claim 16, wherein the at least one memory device includes a target refresh circuit configured to receive a refresh management command from the controller and to perform the refresh operation based on the weighted access count in response to the refresh management command.

20. The memory system of claim 19, wherein the controller is configured to receive a warning signal for a row hammer attack from the at least one memory device and transmit the refresh management command to the at least one memory device.

* * * * *